United States Patent [19]
Vaccaro et al.

[11] Patent Number: 5,689,125
[45] Date of Patent: Nov. 18, 1997

[54] CADMIUM SULFIDE INTERFACE LAYERS FOR IMPROVING III-V SEMICONDUCTOR DEVICE PERFORMANCE AND CHARACTERISTICS

[75] Inventors: Kenneth Vaccaro, Acton; Andrew Davis, Boston; Helen M. Dauplaise, Brockton; Joseph P. Lorenzo, Stow, all of Mass.

[73] Assignee: The United States of America as represented by the Secretary of the Air Force, Washington, D.C.

[21] Appl. No.: 489,601

[22] Filed: Jun. 12, 1995

[51] Int. Cl.$^6$ ............... H01L 29/778; H01L 31/0328
[52] U.S. Cl. ................................. 257/200; 257/194
[58] Field of Search ........................... 257/200, 194

[56] References Cited

U.S. PATENT DOCUMENTS

| | | | |
|---|---|---|---|
| 4,074,305 | 2/1978 | Johnston, Jr. et al. | 357/67 |
| 4,081,290 | 3/1978 | Bachmann | 257/200 |
| 4,958,203 | 9/1990 | Takikawa | 257/200 |
| 5,294,818 | 3/1994 | Fujita | 257/200 |

OTHER PUBLICATIONS

Studtmann et al, *App. Phys. Lett* 52(15) 11 Apr. 1988 "Pseudomorphic . . . epitaxy" pp. 1249–1251.
Lincot et al, *Appl. Phys. Lett* 64(5) 31 Jan. 1994 "Epitaxial . . . Solutions" pp. 569–571.

*Primary Examiner*—Jerome Jackson
*Attorney, Agent, or Firm*—Robert L. Nathans

[57] ABSTRACT

In a Schottky metal junction semiconductor device, a CdS interface layer, having a thickness of under 100 angstroms, is positioned under the Schottky barrier gate of a III-V HEMT, for reducing gate leakage, and for enabling full depletion of the conducting channel. A similar layer is positioned under the insulator of an MIS device having an InP substrate. The CdS layers are deposited from a chemical bath which merely entails a simple, safe and readily controllable additional step in the otherwise conventional manufacturing process of these devices.

6 Claims, 1 Drawing Sheet

CADMIUM SULFIDE INTERFACE LAYERS FOR IMPROVING III-V SEMICONDUCTOR DEVICE PERFORMANCE AND CHARACTERISTICS

STATEMENT OF GOVERNMENT INTEREST

The invention described herein may be manufactured and used by or for the Government for governmental purposes without the payment of any royalty thereon.

BACKGROUND OF THE INVENTION

The present invention relates to the field of electronic semiconductor devices.

The III-V compound InP is recognized as a superior material for high frequency opto-electronic circuits. The availability of epitaxial, lattice-matched, and strained ternaries and quarternaries of InGaAlAs on InP permits production of high electron mobility transistors (HEMTs), hetrojunction bipolar transistors (HBTs), optical detectors, lasers and opto-electronic devices such as metal-semiconductor field effect transistors (MESFETs), and metal oxide field effect transistors (MOSFETs). Although such high quality epitaxial material is commercially available, the ability to form well-behaved high quality interfaces between the epitaxial semiconductor and insulators or Schottky metals remains elusive. Device performance in which semiconductor/insulator and semiconductor/Schottky metal interfaces are critical are impeded by high surface state densities and inadequate barrier heights. The low interface quality, due to the inability to control and stabilize the InP surface, even at room temperature, has long hampered the realization of the full potential of the aforesaid electronic and opto-electronic InP based devices. One desired goal of the present invention is to reduce the resulting gate leakage of HEMTs, whereby the Schottky barrier has a low leakage current and full depletion of the conducting channel is enabled. It is a further goal of the invention to reduce the dark current of the aforesaid optical detectors.

SUMMARY OF A PREFERRED EMBODIMENT OF THE INVENTION

The aforesaid goals have been substantially achieved by producing an interface layer of cadmium sulfide (CdS), having a thickness of between 50-70 angstroms, positioned between the epitaxial semiconductor and the insulator or Schottky metal of the aforesaid devices. The ICL is preferably produced by the use of chemical bath deposition at 30-90 degrees C. A simple timed dip in the bath is the only modification required to the standard manufacturing process. Fresh baths can be prepared in a matter of seconds and the process is safe and readily controllable.

BRIEF SUMMARY OF THE DRAWINGS

Various features and advantages of the invention will become more apparent upon study of the following description, taken in connection with the drawings in which.

DETAILED DESCRIPTION OF EMBODIMENTS OF THE INVENTION

Figure 1:
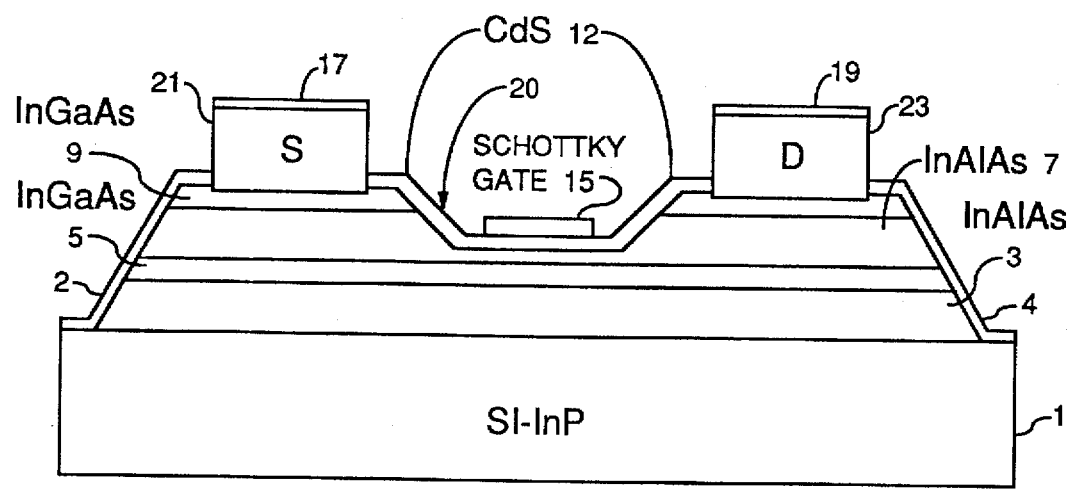
FIG. 1 discloses the application of the ICL to an InGaAs/InAlAs HEMT.

In FIG. 1, a semi-insulating InP substrate 1 has layers 3,5,7, and 9 epitaxially grown thereon by known techniques. Layer 3 is an InAlAs buffer; layer 5 is an InGaAs channel; layer 7 is an InAlAs barrier; and layer 9 is an InGaAs cap. The mesas 2 and 4 are formed with a phosphoric acid based etch, selectively removing the undesired epitaxial material. Ohmic contacts 17 and 19 are evaporated and annealed upon the silicon dioxide source and drain regions 21 and 23, in turn formed upon cap layer 9 to provide the source and drain elements of the HEMT. Channel region 20 is recessed with a succinic acid-based etch to partially remove cap layer 9 as shown. The sample is then placed in the CdS bath to passivate the exposed channel region 20. The Schottky gate 15 is aligned to the recess and its TiAu metal is sited with a photoresist lift-off process. The resulting CdS layer 12 beneficially results in the desired reduced gate leakage and lower output conductance. A post-gate metal annealing step is used to optimize the device characteristics.

Figure 2:
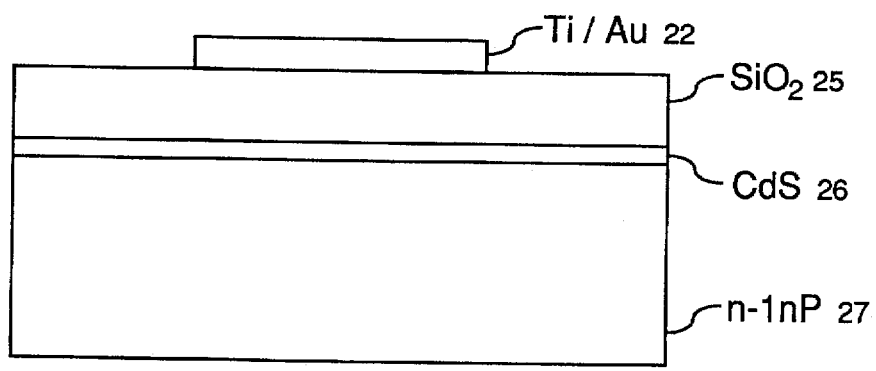
FIG. 2 illustrates the application of the ICL to a metal-insulator-semiconductor (MIS) device.

In FIG. 2, a metal-insulator-semiconductor (MIS) device is shown, having an electrode of Ti/Au 22 overlaying a silicon dioxide layer 25, having a thickness of about 500 angstroms, and which is supported by n-InP (100) substrate 27 via the CdS interface layer 26 having a thickness of between 50–70 angstroms. As in the FIG. 1 embodiment, the interface layer prevents native oxide formation and reduces the number of surface traps, which adversely affect electrical and optical performance of standard III-V devices.

Samples of the devices of FIGS. 1 and 2 were prepared by chemical bath deposition in an aqueous solution of VLSI grade ammonium hydroxide, hydrated cadmium sulfate ($3CdSO_4 \cdot 8H_2O$) and thiourea ($CS(NH_2)_2$). Bath concentrations were 0.028M (moles/liter of solution) thiourea, 0.014M cadmium sulfate, and 17.2M ammonium hydroxide. Growth times ranged from 5 seconds to 45 minutes at growth temperatures of 60–80 degrees C. Growth rates of CdS layers studied were about 20 angstroms/min. The growth rate was found to be sensitive to the concentration of ammonium hydroxide, increasing as its concentration is lowered. A relatively high concentration of ammonium hydroxide was selected for this study, as only a very thin layer of about 50–70 angstroms was desired for surface passivation.

Deposition of crystalline layers of CdS on InP by chemical bath deposition has been previously published. See Lincot et al., Appl. Phys. Lett. 64(5), 31 Jan. 1994. However, the use of CdS layers for the applications and purposes described herein is novel. Metal-semiconductor-metal light detectors have been fabricated with our CdS interface layers. For this purpose, the mesa is formed, CdS is deposited on the sample, and the gate fingers are positioned on the mesa with a photoresist liftoff process. Leakage currents were reduced by over an order of magnitude compared to untreated samples. For further details of the foregoing techniques, see our paper entitled "Chemical and Electrical Analysis of CdS interlayers on InP and related materials", Proceedings of SPIE International Symposium on Aerospace/Defense and Control and Dual-Use Photonics, Orlando Fla., 17–21 Apr. 1995. See also Proceedings of Seventh International Conference on Indium Phosphide and Related Materials, Sapporo, Hokkaido, Japan, May 9–13, 1995, pg 817, IEEE Catalog #95CH35720.

While preferred embodiments have been described, variations will be apparent to the worker in the art and thus the scope of the invention is to be limited solely by the terms of the following claims and art recognized equivalents thereof.

What is claimed is:

1. A metal-insulator-semiconductor (MIS) electronic device comprising:

(a) an InP substrate;

(b) an electrically conductive gate;

(c) an insulator positioned under said gate; and (d) an additional CdS interface control layer having a thickness of less than 70 angstroms, formed between said insulator and said InP substrate.

2. The device of claim 1 wherein said interface layer has a thickness of between about 50–70 angstroms.

3. The device of claim 1 wherein said insulator is silicon dioxide.

4. The device of claim 2 wherein said insulator is silicon dioxide.

5. A Schottky metal junction semiconductor electronic device comprising:

(a) an InP substrate;

(b) a III-V semiconductor body epitaxially grown on said InP substrate;

(c) a Schottky barrier gate positioned above said III-V semiconductor body; and (d) an additional CdS interface control layer having a thickness of about 70 angstroms or less, positioned between said Schottky barrier gate and said III-V semiconductor body.

6. The device of claim 5 wherein said interface layer has a thickness of between about 50–70 angstroms.

* * * * *